United States Patent
Gopalakrishnan et al.

(10) Patent No.: US 10,209,922 B2
(45) Date of Patent: Feb. 19, 2019

(54) COMMUNICATION VIA A MEMORY INTERFACE

(71) Applicant: Rambus Inc., Sunnyvale, CA (US)

(72) Inventors: Liji Gopalakrishnan, Sunnyvale, CA (US); Vlad Fruchter, Los Altos, CA (US); Lawrence Lai, San Jose, CA (US); Pradeep Batra, Santa Clara, CA (US); Steven C. Woo, Saratoga, CA (US); Wayne Frederick Ellis, Campbell, CA (US)

(73) Assignee: Rambus Inc., Sunnyvale, CA (US)

( * ) Notice: Subject to any disclaimer, the term of this patent is extended or adjusted under 35 U.S.C. 154(b) by 529 days.

(21) Appl. No.: 14/806,788

(22) Filed: Jul. 23, 2015

(65) Prior Publication Data
US 2015/0324309 A1 Nov. 12, 2015

Related U.S. Application Data

(63) Continuation of application No. 14/064,167, filed on Oct. 27, 2013, now Pat. No. 9,098,209, and a
(Continued)

(51) Int. Cl.
*G06F 3/06* (2006.01)
*G06F 13/16* (2006.01)
(Continued)

(52) U.S. Cl.
CPC ............ *G06F 3/0659* (2013.01); *G06F 3/061* (2013.01); *G06F 3/0671* (2013.01); *G06F 12/06* (2013.01);
(Continued)

(58) Field of Classification Search
CPC ............... G06F 12/0623; G06F 12/121; G06F 2212/2532; G06F 9/5016; G06F 3/0685;
(Continued)

(56) References Cited

U.S. PATENT DOCUMENTS 5,237,673 A 8/1993 Orbits et al.
5,269,013 A 12/1993 Abramson et al.
(Continued)

FOREIGN PATENT DOCUMENTS

EP 0492938 B1 11/1995
EP 0664030 B1 5/1999
(Continued)

OTHER PUBLICATIONS

Advanced Micro Devices, Inc., "AMD Accelerated Parallel Processing," Programming Guide, OpenCI, Rev. 1.3c, Jun. 2011, pp. 1-210, part 1 of 3. 70 pages.
(Continued)

*Primary Examiner* — Ernest Unelus
(74) *Attorney, Agent, or Firm* — The Neudeck Law Firm, LLC

(57) ABSTRACT

A memory space of a module connected to a memory controller via a memory interface may be used as a command buffer. Commands received by the module via the command buffer are executed by the module. The memory controller may write to the command buffer out-of-order. The memory controller may delay or eliminate writes to the command buffer. Tags associated with commands are used to specify the order commands are executed. A status buffer in the memory space of the module is used to communicate whether commands have been received or executed. Information received via the status buffer can be used as a basis for a determination to re-send commands to the command buffer.

20 Claims, 12 Drawing Sheets

Related U.S. Application Data continuation-in-part of application No. PCT/US2012/052000, filed on Aug. 23, 2012, and a continuation-in-part of application No. PCT/US2012/052043, filed on Aug. 23, 2012, and a continuation-in-part of application No. PCT/US2012/052052, filed on Aug. 23, 2012, and a continuation-in-part of application No. PCT/US2012/052059, filed on Aug. 23, 2012.

(60) Provisional application No. 61/732,898, filed on Dec. 3, 2012, provisional application No. 61/526,953, filed on Aug. 24, 2011, provisional application No. 61/647,986, filed on May 16, 2012, provisional application No. 61/670,874, filed on Jul. 12, 2012, provisional application No. 61/691,134, filed on Aug. 20, 2012.

(51) Int. Cl.
*G06F 12/06* (2006.01)
*G11C 7/10* (2006.01)

(52) U.S. Cl.
CPC .......... *G06F 13/16* (2013.01); *G06F 13/1626* (2013.01); *G06F 13/1668* (2013.01); *G06F 13/1621* (2013.01); *G11C 7/10* (2013.01)

(58) Field of Classification Search
CPC ...... G06F 3/0604; G06F 3/0647; G06F 3/064; G06F 3/068; G06F 3/0659; G06F 3/061; G06F 12/06
See application file for complete search history.

(56) References Cited

U.S. PATENT DOCUMENTS

| | | | |
|---|---|---|---|
| 6,216,178 | B1 | 4/2001 | Stracovsky et al. |
| 6,286,092 | B1 | 9/2001 | Frank et al. |
| 6,453,370 | B1 | 9/2002 | Stracovsky et al. |
| 6,510,474 | B1 | 1/2003 | Stracovsky et al. |
| 6,526,484 | B1 | 2/2003 | Stacovsky et al. |
| 6,542,971 | B1 | 4/2003 | Reed |
| 6,864,896 | B2 | 3/2005 | Perego |
| 6,970,891 | B1 | 11/2005 | Deo et al. |
| 7,024,518 | B2 | 4/2006 | Halbert et al. |
| 7,032,158 | B2 | 4/2006 | Alvarez, II et al. |
| 7,107,412 | B2 | 9/2006 | Klein et al. |
| 7,162,627 | B2 | 1/2007 | Chen |
| 7,171,494 | B2 | 1/2007 | Karamanolis et al. |
| 7,287,103 | B2 | 10/2007 | Ganfield et al. |
| 7,383,416 | B2 | 6/2008 | Oeschay et al. |
| 7,424,552 | B2 | 9/2008 | Burton |
| 7,480,830 | B2 | 1/2009 | Cowell et al. |
| 7,490,211 | B2 | 2/2009 | Schnepper |
| 7,506,110 | B2 | 3/2009 | Neils et al. |
| 7,525,547 | B1 | 4/2009 | Diard |
| 7,526,634 | B1 | 4/2009 | Duluk, Jr. et al. |
| 7,539,812 | B2 | 5/2009 | Tetrick |
| 7,623,134 | B1 | 11/2009 | Danilak |
| 7,633,505 | B1 | 12/2009 | Kelleher |
| 7,680,968 | B2 | 3/2010 | Burton |
| 7,689,734 | B2 | 3/2010 | Bellows |
| 7,694,093 | B2 | 4/2010 | Shaw et al. |
| 7,716,411 | B2 | 5/2010 | Panabaker et al. |
| 7,796,414 | B2 | 9/2010 | Hofstra |
| 7,870,323 | B2 | 1/2011 | Matsumoto et al. |
| 7,941,591 | B2 | 5/2011 | Aviles |
| 7,970,956 | B2 | 6/2011 | Asaro et al. |
| 7,996,602 | B1 | 8/2011 | Warnes et al. |
| 8,006,057 | B2 | 8/2011 | LaBerge |
| 8,054,676 | B2 | 11/2011 | Tanguay et al. |
| 8,131,913 | B2 | 3/2012 | Pyeon |
| 8,364,867 | B2 | 1/2013 | Karamcheti et al. |
| 2002/0059492 | A1 | 5/2002 | Sabotta et al. |
| 2003/0154370 | A1 | 8/2003 | Lai et al. |
| 2004/0034753 | A1 | 2/2004 | Jeddeloh |
| 2004/0049624 | A1 | 3/2004 | Salmonsen |
| 2004/0230718 | A1 | 11/2004 | Polzin et al. |
| 2004/0260864 | A1 | 12/2004 | Lee et al. |
| 2005/0223303 | A1 | 10/2005 | Zimmerman et al. |
| 2006/0041711 | A1 | 2/2006 | Miura et al. |
| 2006/0200723 | A1 | 9/2006 | Carnevale et al. |
| 2006/0248253 | A1 | 11/2006 | Wang |
| 2006/0267990 | A1 | 11/2006 | Rogers et al. |
| 2007/0064500 | A1 | 3/2007 | Harmsze et al. |
| 2007/0079049 | A1 | 4/2007 | LaBerge |
| 2007/0079185 | A1* | 4/2007 | Totolos, Jr. ........... G06F 11/106 714/718 |
| 2007/0121389 | A1 | 5/2007 | Wu et al. |
| 2007/0132770 | A1 | 6/2007 | Stefanidis et al. |
| 2007/0195613 | A1 | 8/2007 | Rajan et al. |
| 2007/0283337 | A1 | 12/2007 | Kasahara et al. |
| 2007/0283358 | A1 | 12/2007 | Kasahara et al. |
| 2008/0077740 | A1 | 3/2008 | Clark et al. |
| 2008/0082488 | A1 | 4/2008 | Terrell |
| 2008/0109592 | A1 | 5/2008 | Karamcheti et al. |
| 2008/0109593 | A1* | 5/2008 | Karamcheti .......... G06F 9/5016 711/103 |
| 2008/0126690 | A1 | 5/2008 | Rajan et al. |
| 2008/0155187 | A1 | 6/2008 | Skerlj |
| 2008/0256416 | A1 | 10/2008 | Ozawa |
| 2009/0037657 | A1 | 2/2009 | Bresniker |
| 2009/0157989 | A1 | 6/2009 | Karamcheti et al. |
| 2009/0248957 | A1 | 10/2009 | Tzeng |
| 2009/0248958 | A1 | 10/2009 | Tzeng |
| 2009/0248959 | A1 | 10/2009 | Tzeng |
| 2009/0249015 | A1 | 10/2009 | Tzeng |
| 2009/0276559 | A1 | 11/2009 | Allen, Jr. et al. |
| 2009/0319719 | A1 | 12/2009 | Perego et al. |
| 2009/0327596 | A1 | 12/2009 | Christenson et al. |
| 2010/0017650 | A1 | 1/2010 | Chin et al. |
| 2010/0211728 | A1 | 8/2010 | Naujokat |
| 2010/0217924 | A1 | 8/2010 | Panabaker et al. |
| 2010/0293420 | A1 | 11/2010 | Kapil et al. |
| 2011/0023040 | A1 | 1/2011 | Hendry et al. |
| 2011/0035539 | A1 | 2/2011 | Honda |
| 2011/0035575 | A1 | 2/2011 | Kwon |
| 2011/0066903 | A1* | 3/2011 | Foster, Sr. ............ G06F 1/206 714/723 |
| 2011/0082971 | A1 | 4/2011 | Berke |
| 2011/0099244 | A1 | 4/2011 | Yang et al. |
| 2011/0145493 | A1 | 6/2011 | Ahn et al. |
| 2011/0153916 | A1 | 6/2011 | Chinnaswamy et al. |
| 2011/0153925 | A1 | 6/2011 | Bains et al. |
| 2011/0239043 | A1 | 9/2011 | Vedder et al. |
| 2012/0102292 | A1 | 4/2012 | Rajan et al. |
| 2012/0204079 | A1 | 8/2012 | Takefman et al. |
| 2013/0042056 | A1 | 2/2013 | Shats et al. |
| 2013/0086309 | A1 | 4/2013 | Lee et al. |
| 2013/0117503 | A1 | 5/2013 | Nellans et al. |
| 2013/0138874 | A1 | 5/2013 | Okin et al. |
| 2014/0223262 | A1 | 8/2014 | Takefman et al. |

FOREIGN PATENT DOCUMENTS

| | | |
|---|---|---|
| EP | 1652058 | 5/2011 |
| WO | WO-2004-092904 A2 | 10/2004 |
| WO | WO-2006-122932 | 11/2006 |
| WO | WO-2013-016723 A2 | 1/2013 |
| WO | WO-2013-028859 A1 | 2/2013 |

OTHER PUBLICATIONS

Advanced Micro Devices, Inc., "AMD Accelerated Parallel Processing," Programming Guide, OpenCI, Rev. 1.3c, Jun. 2011, pp. 1-210, part 2 of 3. 70 pages.

Advanced Micro Devices, Inc., "AMD Accelerated Parallel Processing," Programming Guide, OpenCI, Rev. 1.3c, Jun. 2011, pp. 1-210, part 3 of 3. 70 pages.

EP Extended Search Report dated Apr. 30, 2015 in EP Application No. 15156155.2. 7 pages.

(56) References Cited

OTHER PUBLICATIONS

PCI-SIG Engineering Change Notice, "Resizable BAR Capability," Jan. 22, 2008, Updated and Approved by PWG on Apr. 24, 2008, PCI Express Base Specification version 2.0. 9 pages.

PCT International Search Report and Written Opinion dated Dec. 20, 2012 in International Application No. PCT/US2012/052043. 11 pages.

PCT International Search Report and Written Opinion dated Dec. 26, 2012 in International Application No. PCT/US2012/052000. 11 pages.

PCT International Search Report and Written Opinion dated Dec. 27, 2012 in International Application No. PCT/US2012/052059. 12 pages.

PCT International Search Report and Written Opinion dated Jan. 2, 2013 in International Application No. PCT/US2012/052052. 8 pages.

Stich, Timo, "GPU Computing on Clusters," Nvidia, Slide Show Presentation, GPU Technology Summit, Israel, May 30, 2011. 28 pages.

Stuart et al., "Multi-GPU MapReduce on GPU Clusters," 2011 IEEE International Parallel & Distributed Processing Symposium, pp. 1068-1079, Oct. 11, 2009. 12 pages.

Wikipedia entry for "Serial Presence Detect" downloaded Jun. 6, 2012 from http://en.wikipedia.org/wiki/Serial_presence_detect. 20 pages.

Wikipedia entry for "Video BIOS" downloaded Jun. 6, 2012 from http://en.wikipedia.org/wiki/Video_BIOS. 1 page.

\* cited by examiner

COMMUNICATION VIA A MEMORY INTERFACE

CROSS-REFERENCE TO RELATED APPLICATIONS

The present application is a continuation of U.S. application Ser. No. 14/064,167, filed Oct. 27, 2013, and titled claims COMMUNICATION VIA A MEMORY INTERFACE, and claims the benefit of U.S. Provisional Application Ser. No. 61/732,898, filed Dec. 3, 2012, and titled METHODS AND SYSTEMS FOR SUPPORTING FUNCTIONS ON A LEGACY MEMORY INTERFACE, and claims the benefit of U.S. Provisional Application Ser. No. 61/526,953, filed Aug. 24, 2011, and titled METHODS AND SYSTEMS FOR MAPPING A PERIPHERAL FUNCTION ONTO A LEGACY MEMORY INTERFACE, and claims the benefit of U.S. Provisional Application Ser. No. 61/647,986, filed May 16, 2012, and titled METHODS AND SYSTEMS FOR MAPPING A PERIPHERAL FUNCTION ONTO A LEGACY MEMORY INTERFACE, and claims the benefit of U.S. Provisional Application Ser. No. 61/670,874, filed Jul. 12, 2012, and titled METHODS AND SYSTEMS FOR MAPPING A PERIPHERAL FUNCTION ONTO A LEGACY MEMORY INTERFACE, and claims the benefit of U.S. Provisional Application Ser. No. 61/691,134, filed Aug. 20, 2012, and titled METHODS AND SYSTEMS FOR MAPPING A PERIPHERAL FUNCTION ONTO A LEGACY MEMORY INTERFACE, and claims the benefit of International Application PCT/US12/52000, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52043, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52052, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52059, filed Aug. 23, 2012, and titled METHODS AND SYSTEMS FOR MAPPING A PERIPHERAL FUNCTION ONTO A LEGACY MEMORY INTERFACE, all ten of which are hereby incorporated herein by reference for all purposes.

DETAILED DESCRIPTION OF THE EMBODIMENTS

Figure 1:
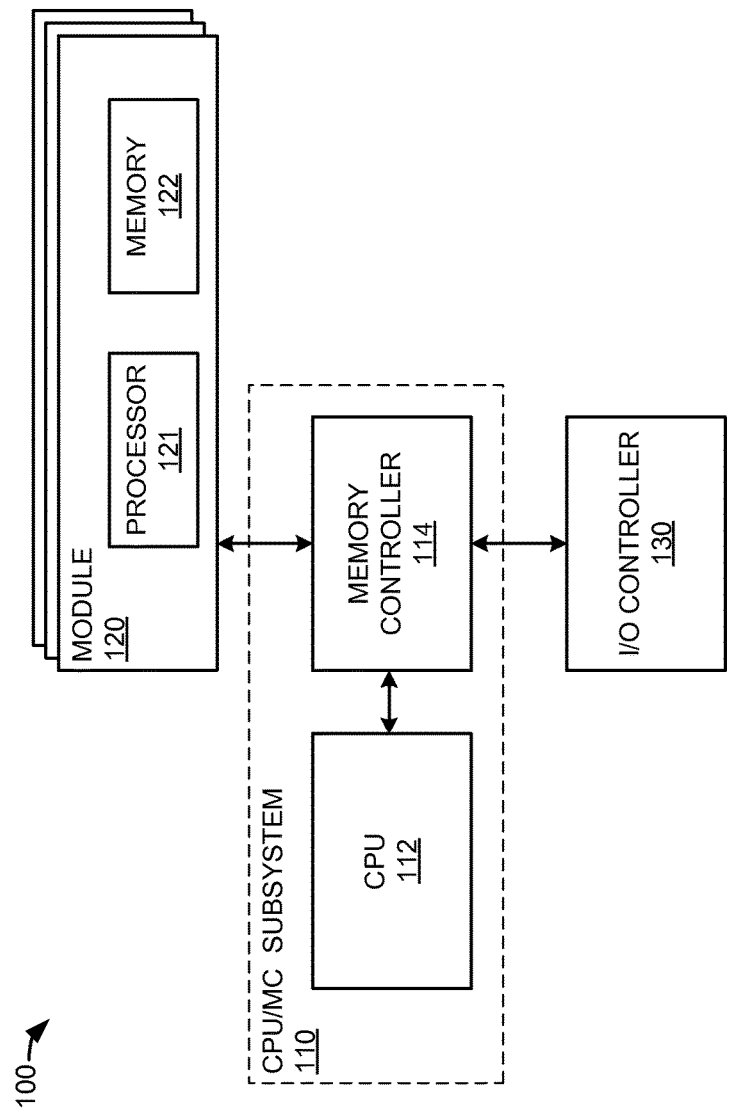
FIG. 1 is a block diagram illustrating a memory architecture.

FIG. 1 is a block diagram illustrating a memory architecture. In FIG. 1, computer system 100 comprises CPU/memory controller subsystem 110, I/O controller 130, and memory modules 120. CPU/memory controller subsystem 110 includes a CPU 112 coupled to a memory controller 114. One or more memory modules 120 are coupled to memory controller 114 in subsystem 110. Each memory module 120 includes processor 121 and memory 122. Processor 121 may be part of a buffer device. Processor 121 may be or comprise a microprocessor, finite state machine, or other logic circuitry that is part of a buffer device. Memory 122 typically contains instructions and/or data used by the CPU 112 and/or processor 121. It should be understood that CPU 112 may include multiple processor cores. CPU 112 may include stacked die devices having one or more processors and/or memory stacked using, for example, though-silicon vias. CPU 112 may include and/or be a specialized processor such as, for example, a digital signal processor, graphics processing unit (GPU), an array processor, storage management processor, data analytic processor (e.g., Hadoop distributed file system processor or a MapReduce processor), pattern recognition processor, and/or image manipulation processor (i.e., image processor). CPU 112 can divide up and coordinate compute processes and tasks among modules 120.

Processor 121 may also be referred to as a "compute engine," "computing engine," "graphics processor," "rendering engine," "processing unit," "accelerator", "offload engine," and/or GPU. Processor 121 may include and/or be a heterogeneous processing unit that includes the functions of one or more of a CPU, GPU, video processor, etc. Processor 121 may include, or be, a serial-ATA (SATA), serial attached SCSI (SAS), eSATA, PATA, IEEE 1394, USB (all revisions), SCSI Ultra, FiberChannel, Infiniband, Thunderbolt, or other industry standard I/O interfaces (such as PCI-Express—PCIe). Processor 121 may include, or be, a network processor unit (NPU) such as a TCP offload engine (TOE), a protocol translator (e.g., TCP over SATA, TCP over PCI-Express, accelerated SCSI interconnect, etc.), and/or a protocol packet translator. Processor 121 may include, or be, a fixed function graphics processing unit, an encryption/decryption accelerator/offload engine (e.g., for implementing/accelerating SSL, AEC, DEC, etc.), a compressor/decompressor, a regular expression accelerator engine, a digital signal processor (DSP), a signal path processor, a Fourier transform processor, an inverse Fourier transform processor, and/or a media format encoder/decoder (e.g., JPEG, DVX, AVI, MP2, MP3, MP4, Blu-ray, HD-DVD, DVD, etc.). It should also be understood that module 120 may be coupled to a local SSD/HDD and/or enterprise storage type systems such as external disks, external disk arrays, JBODs, RAID arrays, tape drives, optical drives, and the like.

Memory 122 typically includes multiple memory devices coupled together to form a block of storage space. Memory 122 may be, or comprise, but is not limited to, SRAM, DDR3, DDR4, DDR5, XDR, XDR2, GDDR3, GDDR4, GDDR5, LPDDR, and/or LPDDR2 and successor memory standards and technologies. Memory 122 may be or comprise a stack of devices such as a through-silicon-via (TSV) stack and/or a hybrid memory cube (HMC). Further information about HMC is available from the Hybrid Memory Cube Consortium (http://hybridmemorycube.org/).

Each processor 121 is capable of performing various memory access and/or data processing functions. For the embodiment shown in FIG. 1, memory controller 114 is also coupled to an I/O controller 130 which controls the flow of data into and out of the system. An optional video input port (not shown in FIG. 1) can provide data to memory controller 114. A display interface (not shown in FIG. 1) can provide data output to one or more devices (such as display devices or storage devices). For systems which support video input or capture capability, a video input port on the memory controller 114 is one way to handle the delivery of video source data. Another means of delivery of video input data to the system would include delivering the data from a peripheral module through the I/O controller 130 to memory controller 114.

In the example of FIG. 1, CPU/memory controller subsystem 110 is coupled to multiple distinct memory modules 120. Each memory module 120 includes processor 121 and memory 122. As described herein, each processor 121 may be part of a buffer device. Processor 121 may be or comprise a microprocessor, finite state machine, or other logic circuitry that is part of a buffer device. Each processor 121 is capable of performing various data processing functions. Thus, the processor 121 on different (or the same) memory modules are capable of performing different processing functions simultaneously (i.e., parallel processing). The processors 121 on different (or the same) memory modules are capable of performing vector parallel processing where functions are vectorized and divided among the processors 121. The processors 121 on different (or the same) memory modules are capable of performing cluster parallel processing where the processors 121 cooperate to work on the same problem simultaneously (or concurrently). Further, each processor 121 is capable of communicating with other processors 121 on other memory modules 120.

Each processor 121 is capable of communicating with other processors 121 on other memory modules 120 with the aid of CPU 112 and/or memory controller 114. Modules 120 and/or processors 121 may be heterogeneous. In other words, modules 120 and/or processors 121 may not all be identical. Processors 121 may include multiple processor cores that are not all identical. For example, processors 121 may comprise a mix of CPU type and GPU type processing cores. Modules 120 and/or processors 121 may perform different functions at the same time. Modules 120 and/or processors 121 may be produced by different vendors. Modules 120 and/or processors 121 produced by different vendors may be added, subtracted, and used interchangeably in a plug-and-play manner. Modules 120 and/or processors 121 may function in parallel running independent (and non-independent) copies of software, processes, applications, and operating systems similar to how virtual machines operate.

CPU 112 can control memory controller 114 to distribute particular processing tasks (such as graphical processing tasks, Hadoop, and/or MapReduce tasks) to processors 121, and can perform certain processing tasks itself. These tasks may include data to be processed and/or instructions to be executed. Although three memory modules 120 are shown in FIG. 1, an alternate system may contain any number of memory modules coupled to one or more memory controllers 114. The ability to add and remove memory modules 120 can provide an upgradeable and scalable memory and computing architecture.

CPU 112 may communicate with processor 121 by reading from, and writing to, an address aperture associated with module 120. CPU 112 can be configured to use any cache policy supported by processor CPU 112 to read from, and write to, this address aperture (or portions thereof). However, it should be understood that, in an embodiment, the most useful cache policies may be limited to configuring the address aperture (or portions thereof) to be treated by CPU 112 as uncacheable memory (UC), write combining memory (WC), or write back (WB). In an embodiment, these cache policies may be combined with the use of certain instructions (e.g., fence instructions, streaming load instructions, and/or streaming write instructions) to achieve an optimal (e.g., highest) communication bandwidth between CPU 112 and processor 121. In addition, when the address aperture (or portions thereof) are configured to be treated as WC or WB, at least a minimum burst size may be used to achieve an optimal (e.g., highest) communication bandwidth between CPU 112 and processor 121. In other words, small burst sizes (e.g., less than a certain, implementation dependent, number of column addresses per burst) may result in less than optimal communication bandwidth between CPU 112 and processor 121. Larger sizes (e.g., greater than a certain, implementation dependent, number of column addresses per burst) may approach (or approximate) an optimal (e.g., highest) communication bandwidth between CPU 112 and processor 121. It should be understood that computer system 100 may utilize a unified memory architecture or a non-unified memory architecture. Computer system 100 is not limited to heterogeneous memory. Further, it should also be understood that computer system 100 (and CPU 112, in particular) may utilize a cache or caching policies that are coherent or not coherent.

It may also be useful to configure the address aperture (or portions thereof) to be UC for testing, ease of implementation, and/or when the bandwidth between CPU 112 and processor 121 is not a relatively high priority. Configuring the address aperture (or portions thereof) to be WB may be most useful for testing purposes. Configuring the address aperture (or portions thereof) to be WC may, in some embodiments, result in the highest bandwidth between CPU 112 and processor 121.

The architecture of FIG. 1 allows CPU 112 to issue high level primitive commands to the processors 121 via memory controller 114. These high level primitive commands may include graphics commands. This can reduce the volume or bandwidth of data that must be communicated between the memory controller 114 and memory modules 120. Thus, the partitioning of memory among multiple memory modules 120 improves data throughput relative to systems in which a single CPU 112 and/or graphics controller performs all processing tasks. A bandwidth reduction to/from CPU 112 can occur because primitive commands and data sent to memory modules 120 typically require significantly less data than the amount of data referenced when rendering the primitive. This is because graphics primitives are typically expressed at a higher level of abstraction. For example, a tessellated surface involving many thousands of primitives (i.e., triangles) is not sent through as many thousands of primitives. Instead, a parametric function describing the surface is sent, thus saving memory bandwidth. In another example, parametric equations for vectors may be sent to save memory bandwidth. In this case, processors 121 can perform any type of interpolations to generate primitives.

Additionally, the system partitioning described allows aggregate bandwidth between processors 121 and memory 122 to be much higher than the bandwidth between memory controller 114 and memory modules 120. Thus, the effective system bandwidth can increase for processing tasks.

In an embodiment, CPU 112 communicates with processor 121 by reading from, and writing to, an address aperture associated with module 120. This address aperture may be further divided into address ranges (a.k.a. ports) that are configured for communication of commands, status, and data. The ports of the address aperture may be configured and sized as blocks of addresses (e.g., column addresses).

Figure 2:
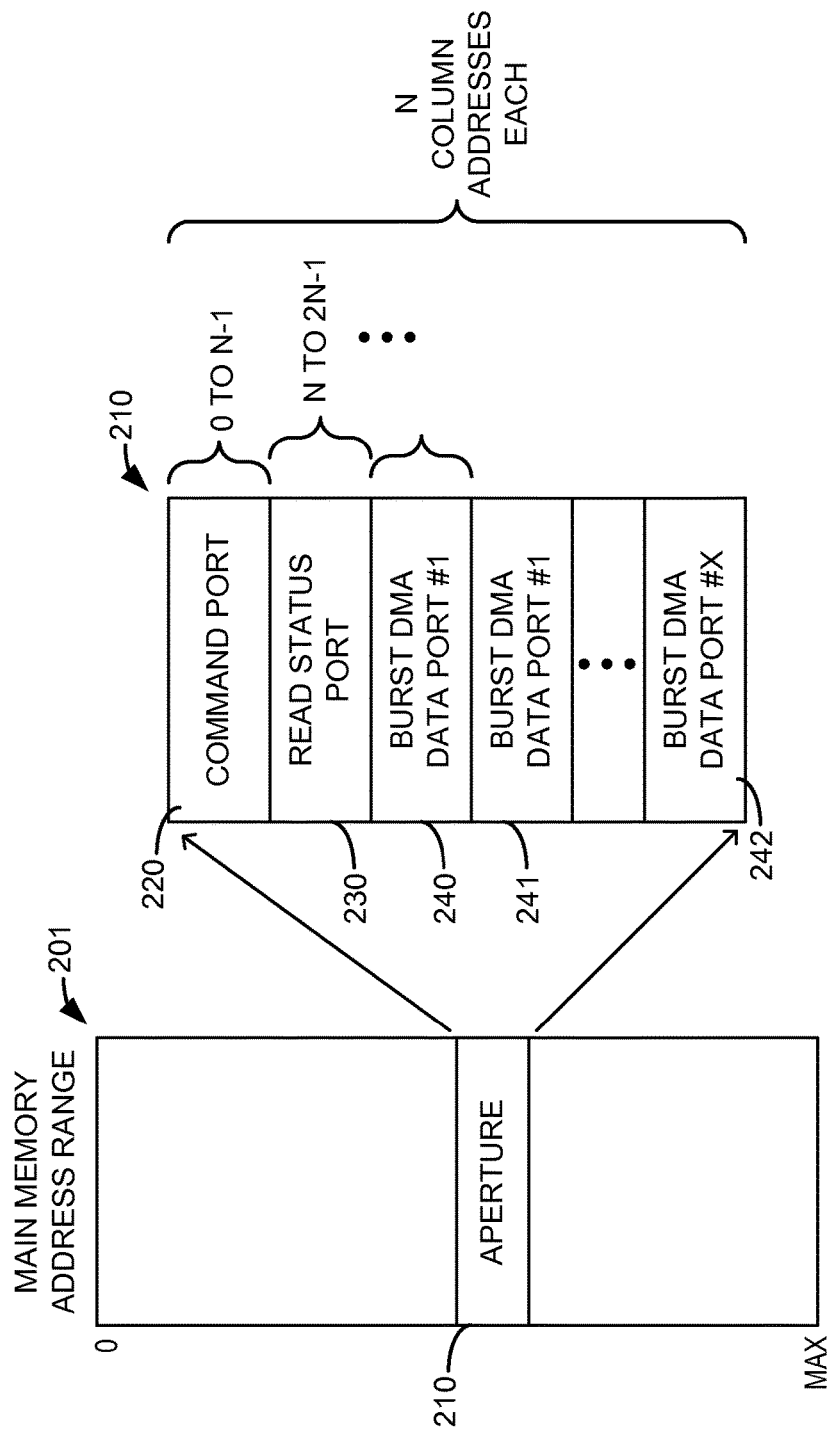
FIG. 2 illustrates a memory address range map for communication via a memory interface.

FIG. 2 illustrates a memory address range map for communication via a memory interface. In FIG. 2, a main memory address range 201 is illustrated. This main memory address range 201 runs from a minimum memory address addressable by CPU 112 to a maximum memory address addressable by CPU 112. Within the main memory address range 201, a range of addresses (which may or may not be contiguous) is configured as an aperture 210. This aperture may be used for communicating with processor 121 via the memory interface between memory controller 114 and module 120.

Aperture 210 is further divided into address ranges that are used as ports for communicating commands, status, and data. In FIG. 2, aperture 210 is divided into a command port 220, a read status port 230, DMA data ports 240-242. Each of command port 220, read status port 230, DMA data ports 240-242 may each be configured to be an arbitrary size or sizes. Each of command port 220, read status port 230, DMA data ports 240-242 may be read or written using DMA operations/instructions. In an example, each of command port 220, read status port 230, DMA data ports 240-242 may be configured to be the same size. For example, each of command port 220, a read status port 230, DMA data ports 240-242 may be configured to be N column addresses each.

Figure 3:
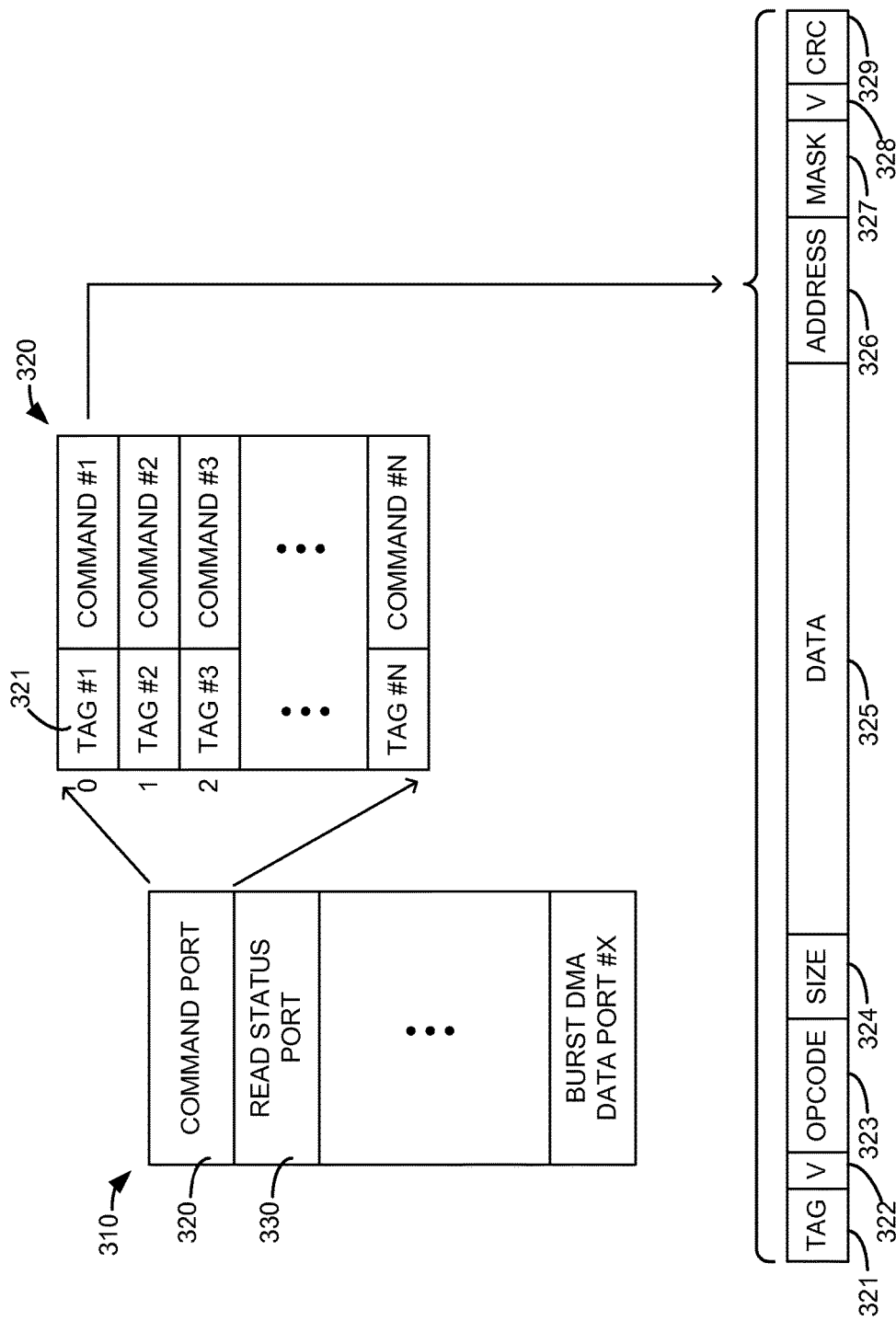
FIG. 3 illustrates an example command port and example command format for communication via a memory interface.

FIG. 3 illustrates an example command port and example command format for communication via a memory interface. In FIG. 3, aperture 310 is divided into a command port 320, read status port 330, and DMA read/write data ports. Aperture 310 may be an aperture used to communicate with module 120. Commands written to an address in command port 320 include a unique tag number field 321 and an associated command field that is divided into further fields. The tag number field 321 and associated command field may be referred to herein as a command-tag pair. An example format used to write a command-tag pair to an address in command port 320 is illustrated. The example command-tag pair format illustrated in FIG. 3 includes tag field 321, valid bit #1 322, opcode field 323, size field 324, data field 325, address field 326, mask field 327, valid bit #2 328, and cyclic redundancy code (CRC) field 329.

Memory controller 114 may not perform writes to command port 320 of module 120 in a deterministic order. In other words, memory controller 114 may perform the writes of command-tag pairs written to command port 320 in a different order than the instructions used to write these command-tag pairs were executed by CPU 112. In an embodiment, tag field 321 can be used by processor 121 to determine an order to execute commands communicated via command port 320. CPU 112 may be instructed to assign tag field 321 values. These tag field 321 values may be unique across the locations in command port 320. These assigned tag field values of the command-tag pairs may be used by processor 121 and/or CPU 112 to determine: (a) whether a particular command-tag pair has been written by memory controller 114 to module 120, and/or (2) what order to execute any received commands once they are written by memory controller 114 to module 120.

For example, consider a case where memory controller 114 writes a command-tag pair to location #1 of command port 320 first, then another command-tag pair to location #0 second, and then yet another command-tag pair to location #2 third. In this case, after the write to locations #1 has been received, processor 121 can determine that it has not yet received a (valid) command-tag pair for locations #0 and #2 because processor 121 has not received writes of command-tag pairs with the tag values associated with tag #1 or tag #3.

Also, after memory controller 114 has written command-tag pairs to location #1 of command port 320 first, location #0 second, and location #2 third, as is illustrated in FIG. 3, location #0 received a command-tag pair associated with tag #1's value, location #1 received a command-tag pair associated with tag #2's value, and location #2 received a command-tag pair associated tag #3's value regardless of the actual order that the writes of these command-tag pairs to module 120 occurred (and also regardless of the order that CPU 112 executed the corresponding write instructions). Thus, because the tag value of a command-tag pair does not change based on the order that the command-tag pair was written by memory controller 114 to module 120, processor 121 can use the tag values to determine an order to execute the commands received from memory controller 114. In other words, processor 121 can use the tag values associated with a command (by the command-tag pairing) to determine an order that these commands are executed even though memory controller 114 (and/or CPU 112) may have written these commands (and their associated tag value) to their respective locations in command port 320 in a different order.

The tag values can also be used by processor 121 to determine whether memory controller 114 and/or CPU 112 have written the same command-tag pair to module 120 more than once. For example, memory controller 114 may write the same command-tag pair to module 120 because of a caching policy implemented by CPU/MC subsystem 110. CPU 112 may, in order to attempt a retry of the command in a command-tag pair that does not appear to have been executed and/or received by module 120, execute write instructions that cause memory controller 114 to write the same command-tag pair to module 120. CPU 112 may assign tag values to command-tag pairs that are unique. CPU 112 may assign tag values to command-tag pairs that are unique over a given set of writes (e.g., a single burst write) to command port 320. CPU 112 may assign tag values to command-tag pairs that are unique over a given set of writes that span the range of addresses of command port 320.

CPU 112 may assign tag values to command-tag pairs that are unique over at least two sets of writes that span the range of addresses of command port 320. By looking for duplicate tag values in the command-tag pairs that memory controller writes to module 120 over the at least two sets of writes, module 120 can determine whether memory controller 114 and/or CPU 112 has written the same command-tag pair to module 120 more than once. In other words, module 120 can ignore a command-tag pair that appears a second (or greater, as the case may be) time over the two (or more) sets of writes that are understood to have unique tag values.

For example, consider a case where command port 320 spans 128 column addresses. For a first set of command-tag pair writes (e.g., a burst write) spanning these 128 column addresses, CPU 112 may assign the tag values 0 to 127—one to each column address. For a second set of command-tag pair writes spanning the same 128 column addresses, CPU 112 may assign the tag values 128 to 255—one to each column address. For a third set of command-tag pair writes spanning the same 128 column addresses, CPU 112 may assign the tag values 256 to 383—one to each column address.

When processor 121 receives a repeat tag value in the range 0-127 before it has received at least one command-tag pair with a tag value in the range 128-255, processor 121 should ignore the second (i.e., repeat) command-tag pair. When processor 121 receives a repeat tag value in the range 0-127 after it has received at least one command-tag pair with a tag value in the range 128-255 it indicates that CPU 112 has started overwriting command port 320 with a second (new) set of command-tag pairs. If processor 121 receives a tag value in the range 0-127 after it has received at least one command-tag pair with a tag value in the range 128-255, processor 121 can ignore command-tag pairs in the range 0-127. Since CPU 112 has started overwriting command port 320 with a second set of command-tag pairs, processor 121 should ignore the command-tag pairs with tag values in the range 0-127 in order to avoid executing the same command twice.

Likewise, when processor 121 receives a repeat tag value in the range 128-255 after it has received at least one command-tag pair with a tag value in the range 256-383, this indicates that CPU 112 has started overwriting command port 320 with a third set of command-tag pairs. The tag values may be reused (i.e., their values "wrapped around" a maximum value) by CPU 112. For example, CPU 112 may reuse the tag values 0-127 after memory controller 114 sends the command-tag pairs in the range 256-383. In other words, when processor 121 receives a tag value in the range 256-383 after it has received at least one command-tag pair with a tag value in the range 0-127, this indicates that CPU 112 has started overwriting command port 320 with the third set of command-tag pairs.

Valid bit #1 322 and valid bit #2 328 can be used by CPU 112 and processor 121 to determine whether memory controller 114 has written all of a command-tag pair to a particular location. Memory controller 114 may perform a write to a location of command port 320 using multiple write operations to module 120. For example, consider the case of a write to location #1 of command port 320. This write may be a result of a single write instruction executed by CPU 112. However, memory controller 114 may, for example, perform the following (in order): (1) read the contents of location #1 of command port 320; (2) after module 120 returns data associated with location #1 of command port 320, memory controller 114 may replace only a portion of the data received from module 120 with new data forming a (possibly nonsensical) command-tag pair that is part new data and part retrieved data; (3) this partially new command-tag pair is then written to module 120; (4) at some later time, memory controller 114 may again read the contents of location #1 of command port 320; (5) after module 120 returns data associated with location #1 of command port 320 (which can be part old data and part new data, or some arbitrary data), memory controller 114 may replace the remaining unwritten portion of the data received from module 120 with the rest of the new data (possibly thereby forming a command-tag pair that has a complete new command-tag pair); and, (6) this new data containing the remaining unwritten portion of the data is then written to location #1.

To determine whether memory controller 114 has written all of a command-tag pair to a particular location, CPU/MC subsystem 110 and module 120 may cooperate in the following (example) manner: (a) when memory controller 114 first reads the contents of location #1 of command port 320 (step 1, above), module 120 returns data associated with location #1 that has valid bit #1 322 and valid bit #2 328 both set to indicate that the data is invalid (e.g., both set to a logic "0"); (b) when memory controller 114 replaces only portion of the data received from module 120 with new data (step 2, above), the new data has a corresponding valid bit set to indicate that the data is valid (e.g., set to a logic "1")—thus the command-tag pair formed from part new data and part retrieved data has one valid bit 322 or 328 set to indicate valid data and one valid bit 322 or 328 set to indicate that data is invalid; (c) when the partially new command-tag pair entry is written to module 120 (step 3, above), processor 121 can determine that part of the data is invalid from the one valid bit 322 or 328 which is set to indicate that at least some data is invalid (e.g., from the bit that is set to a logic "0"); (d) when memory controller 114 reads the contents of location #1 of command port 320 again (step 4, above), processor 121 returns data associated with location #1 that again has both valid bit 322 and 328 set to indicate that at least some data is invalid (e.g., both set to a logic "0", or one set to a logic "1" and one set to a logic "0", as appropriate); (e) memory controller 114 may then replace the remaining unwritten data portion with the rest of the new data thereby forming data that includes the unwritten data and corresponding valid bit 322 or 328 set to indicate that its respective part of the data is valid (step 5, above); and, (f) when this data is written to location #1 by memory controller 114 (step 6, above), processor 121 can determine that the remaining unwritten data portion has been received from memory controller 114 by the state of the appropriate valid bit #1 322 or valid bit #2 328 in the remaining portion. In an embodiment, after the command of a command-tag pair is executed, module 120 will return data associated with location #1 that has valid bit #1 322 and valid bit #2 328 both set to indicate that the data is invalid (return to step 1, above).

In FIG. 3, two valid bits 322 and 328 are illustrated. However, it should be understood that the number of valid bits should correspond to the number of parts that memory controller 114 may split the data when using multiple write operations to module 120. For example, if memory controller 114 writes 64 bytes at a time, but may perform these writes by using multiple writes of the new data in segments as small as 16 bytes, then 4 valid bits should be used. Each of these four valid bits should be located in different 16 byte segments of the 64 byte write data.

Figure 4:
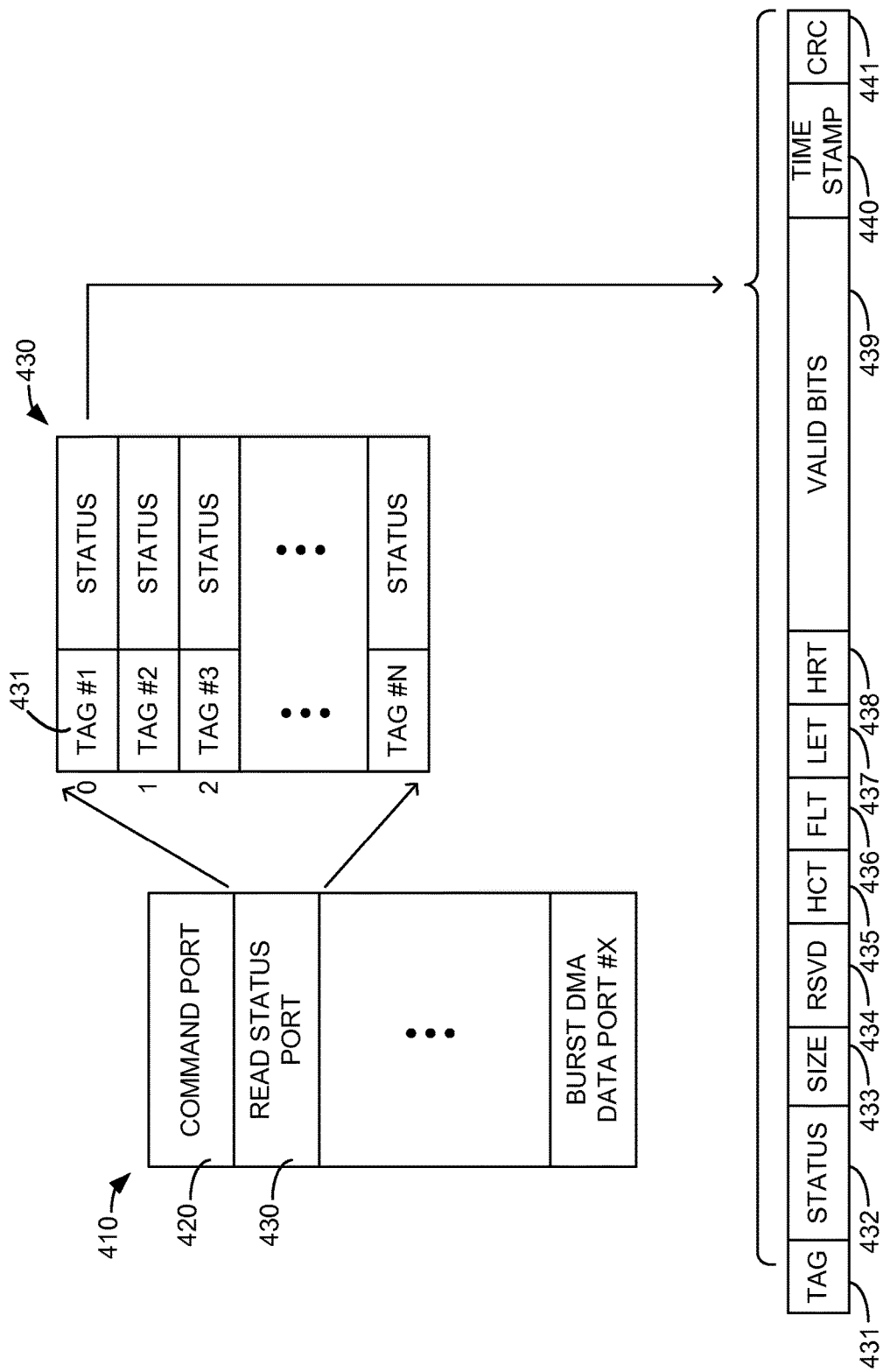
FIG. 4 illustrates an example status port and example status information format for communication via a memory interface.

FIG. 4 illustrates an example status port and example status information format for communication via a memory interface. In FIG. 4, aperture 410 is divided into a command port 420, read status port 430, and DMA read/write data ports. Aperture 410 may be used to communicate with module 120. In an embodiment, each command port 420 entry is associated with a corresponding read port 430 entry. Reads made from an address in read status port 430 includes a unique tag number field 421 and an associated status field that is divided into further fields. This may be referred to herein as a tag-status pair. An example format that can be used to provide data in response to a read from an address in status port 430 is illustrated. The example status entry illustrated in FIG. 4 includes tag field 431, status field 432, size field 433, a reserved or unused field 434, highest continuous tag (HCT) field 435, first location tag (FLT) field 436, last executed tag (LET) field 437, highest received tag (HRT) field 438, valid bits field 439, time stamp field 440, and CRC field 441.

In an embodiment, the contents of the status-tag pairs sent by module 120 in response to a read by memory controller 114 can be used by CPU/MC subsystem 110 to determine the status of command-tag pairs written to command port 320. For example, when memory controller 114 reads a location in status port 430, the HCT field 435 returned by module 120 can indicate the tag value where all of the preceding (e.g., with lower valued tags) command-tag pairs to be executed have been received by module 120. The LET field can indicate the tag value where all of the preceding (e.g., with lower valued tags) commands have been executed by module 120. The HRT field can indicate the tag value of the most subsequent (e.g., highest valued tag) command-tag pair that has been received.

The contents of the status-tag pairs sent by module 120 (and therefore received by CPU/MC subsystem 110) may also include, for example, a valid bits field 439 map that indicates the status of each command-tag pair within a range of tag values. Alternatively, the valid bits field 439 map can indicate a status of each command-tag pair in association with its address within command port 320. The first location tag (FLT) field 436 can indicate a starting point for a range of tag values that are associated with each bit in the valid bits field 439.

Each bit in valid bits field 439 can be associated with a command-tag pair (and therefore a tag value). Each bit can indicate a status associated with the respective command-tag pair. For example, the corresponding bit in valid bits field 439 can be set to indicate when a command-tag pair is received for that tag value. This corresponding bit can be reset to indicate when that command has been executed. To illustrate, consider a status-tag pair that has an 12 bit valid bits field 439 with the contents 000011011110b (note: for this discussion, these bits are numbered 0 to 11, left to right), an HCT value of 5, a LET value of 3, and an HRT value of 10. This value indicates: (1) the tag values associated with bits #6 and #11 have not been received; (2) the command-tag pairs associated with bits #4, #5, and #7-#10 have been received; and, (3) the commands associated with bits #0-#3 have been executed by module 120.

In an embodiment, module 120 returns the most current values (as reflected by the current state) for highest continuous tag (HCT) field 435, first location tag (FLT) field 436, last executed tag (LET) field 437, highest received tag (HRT) field 438, valid bits field 439, and time stamp field 440 when module 120 receives a read operation from memory controller 114. Module 120 returns these most current values regardless of the location within status port 430 memory controller 114 reads. The time stamp field 440 received by CPU 112 can be used by CPU 112 to determine which of status-tag pairs read has the most current information. CPU 112 uses the timestamp field 440 to determine which of status-tag pairs read has the most current information because a CPU/MC subsystem 110 caching policy may result in out-of-order reads from module 120, and/or reads being serviced by a cache internal to CPU/MC subsystem 110. Thus, by time stamping the content of data sent in response to each read from status port 430, CPU 112 can determine which status-tag pair received has the most current information about the state of module 120.

The status of command-tag pairs written to command port 320 (as determined by CPU 112 from the contents of the status-tag pairs from module 120) can be used as a basis to retry the communication of commands and/or command-tag pairs. For example, after a threshold period of time, the contents of the valid bits field 439 may indicate a particular command-tag pair has not been received. In response, CPU 112 may execute write instructions that may cause memory controller 114 to write the same command-tag pair to module 120.

The status of command-tag pairs written to command port 320 (as determined by CPU 112 from the contents of the status-tag pairs from module 120) can be used as a basis to attempt to flush command-tag pairs not yet received by module 120 from CPU/MC subsystem 110. For example, after a threshold period of time, the contents of the valid bits field 439 may indicate one or more command-tag pairs have not been received. In response, CPU 112 may execute write instructions to addresses other than command port 320 that may cause memory controller 114 to write the missing command-tag pair(s) to module 120.

Figure 5:
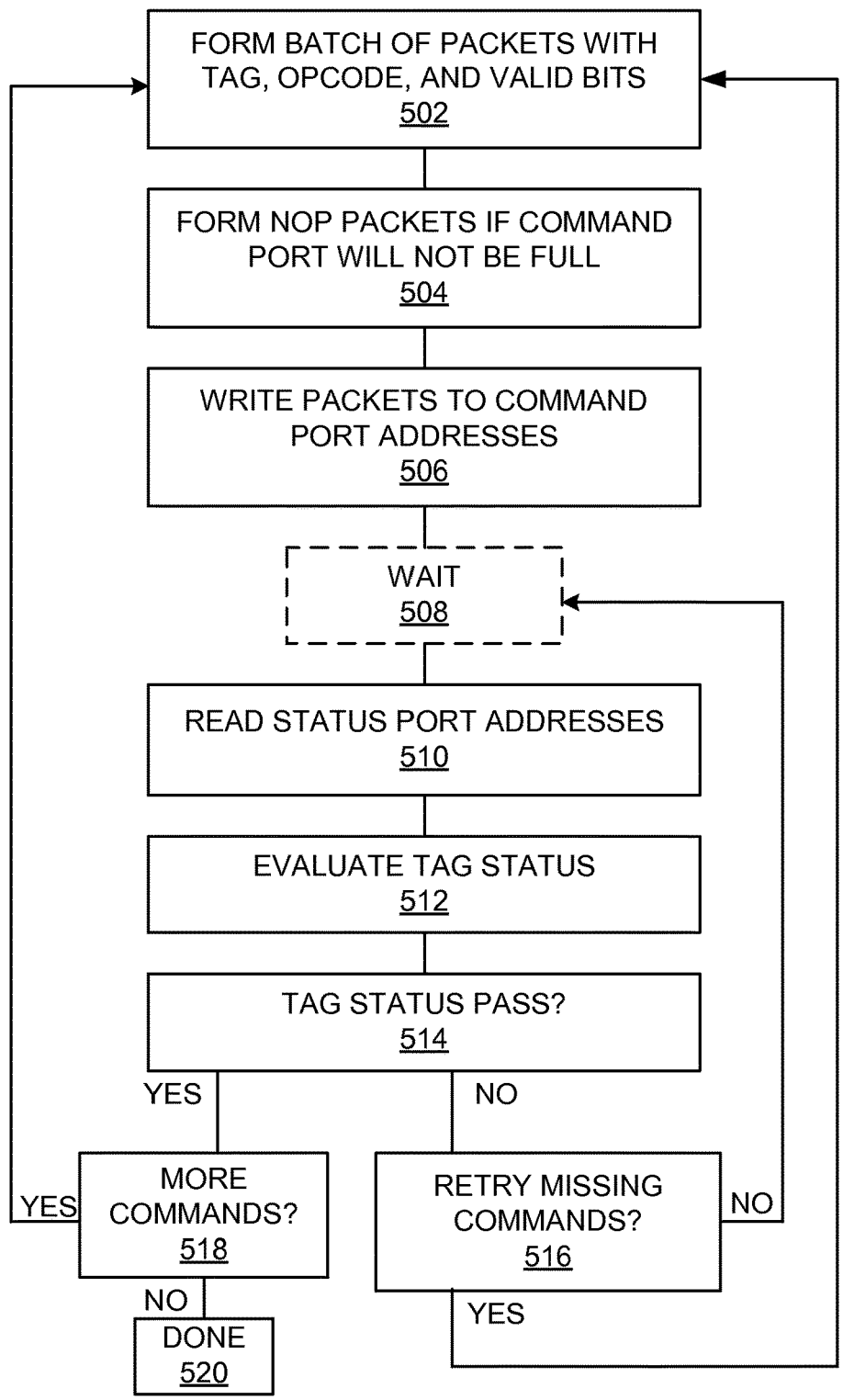
FIG. 5 is a flowchart illustrating a method of communicating via a memory interface.

FIG. 5 is a flowchart illustrating a method of communicating via a memory interface. The steps illustrated in FIG. 5 may be performed by one or more elements of computer system 100. A batch of packets with tag, opcode, and valid bits is formed (504). For example, CPU 112 may assemble a set of command-tag pairs. These command tag pairs may include tag 321, opcode 323, a valid bit #1 322, and a valid bit #2 328. Valid bit #1 322 and valid bit #2 328 may be, for example, placed in different bytes, words, banks, and/or pages such that if memory controller 114 were to perform a read-modify-write operation, valid bits #1 322 and valid bit #2 328 would not both be overwritten with new data during the partial write step of the read-modify-write operation.

Optionally, no-operation (NOP) packets may be formed if a command port will not be full (504). For example, CPU 112 may assemble in a memory a set of command-tag pairs that specify no operation is to be performed. These NOP packets can be used to pad the batch of packets formed in block 502 in order to have a number of command-tag pairs that correspond to the size of command port 320.

The packets are written to command port addresses (506). For example, CPU 112 may execute instructions that write the packets formed in block 502 (and optionally those in block 504, as appropriate) to the memory addresses that correspond to command port 320. Optionally, the method may wait for a period of time (508). Status port addresses are read (510). For example, CPU 112 may execute instructions that read the memory addresses that correspond to status port 430 (or status port 330).

The tag status is evaluated (512). For example, CPU 112 may execute instructions that select the status-tag pair read in block 510 with the latest timestamp. This status-tag pair may then be evaluated to determine whether all of the commands associated with the command-tag pairs written in block 506 have been received (i.e., tag status passes). If the tag status passes, flow proceeds to block 518. If the tag status fails, flow proceeds to block 516 (514).

If the tag status passes, it is determined whether there are more commands to be executed (518). If there are no more commands to be executed, flow terminates in block 520. If there are more commands to be executed, flow proceeds to block 502 to assemble another batch of packets. If the tag status does not pass, it is determined whether to retry one or more missing commands (516). If missing commands are not to be retried, flow proceeds to block 508. This allows more time for missing commands to be processed. If missing commands are to be retried, flow proceeds to block 502 so the missing commands may be assembled into another batch of packets.

Figure 6:
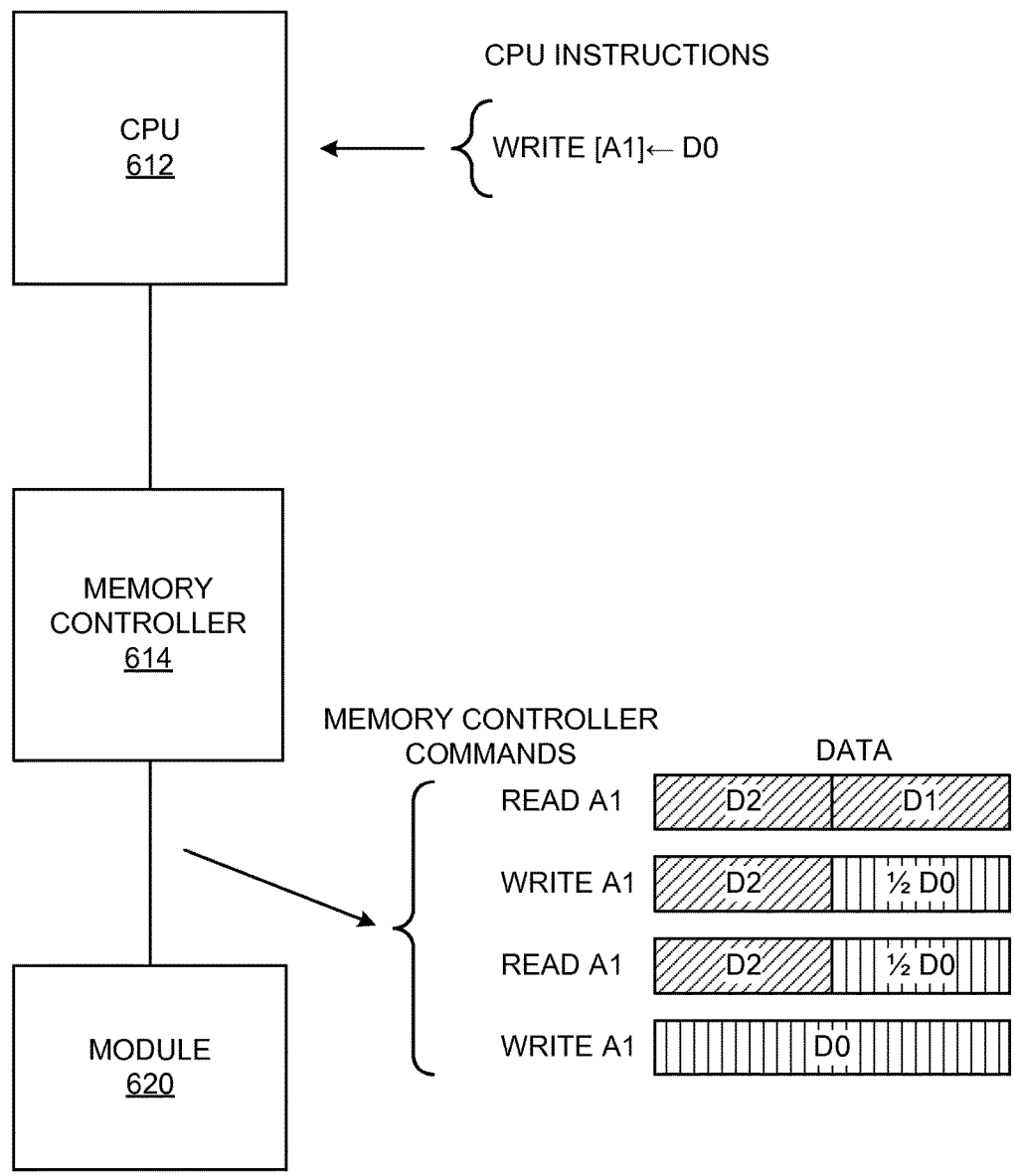
FIG. 6 illustrates a read-modify-write operation.

FIG. 6 illustrates a read-modify-write operation. The read-modify-write operation illustrated in FIG. 6 may be performed by computer system 100. In FIG. 6, CPU 612 receives and executes an instruction to write the data D0 to address A1 which resides in an address range of a command port of module 620. In response to this instruction, CPU 612 couples address A1 and data D0 to memory controller 614. Memory controller 614 then issues a series of commands to module 620. The commands issued to module 620 include (in order, but possibly with other commands intervening): (1) a first read of address A1—this operation returns data to memory controller 614 that has two parts D1 and D2; (2) a write of address A1 with part D1 replaced by a corresponding part of data D0; (3) a second read of address A1—this operation returns data to memory controller 614 that has two parts D1 and the corresponding part of data D0 already written to module 620; (4) a write of address A1 with part D2 replaced by a corresponding remaining part of data D0.

Figure 7:
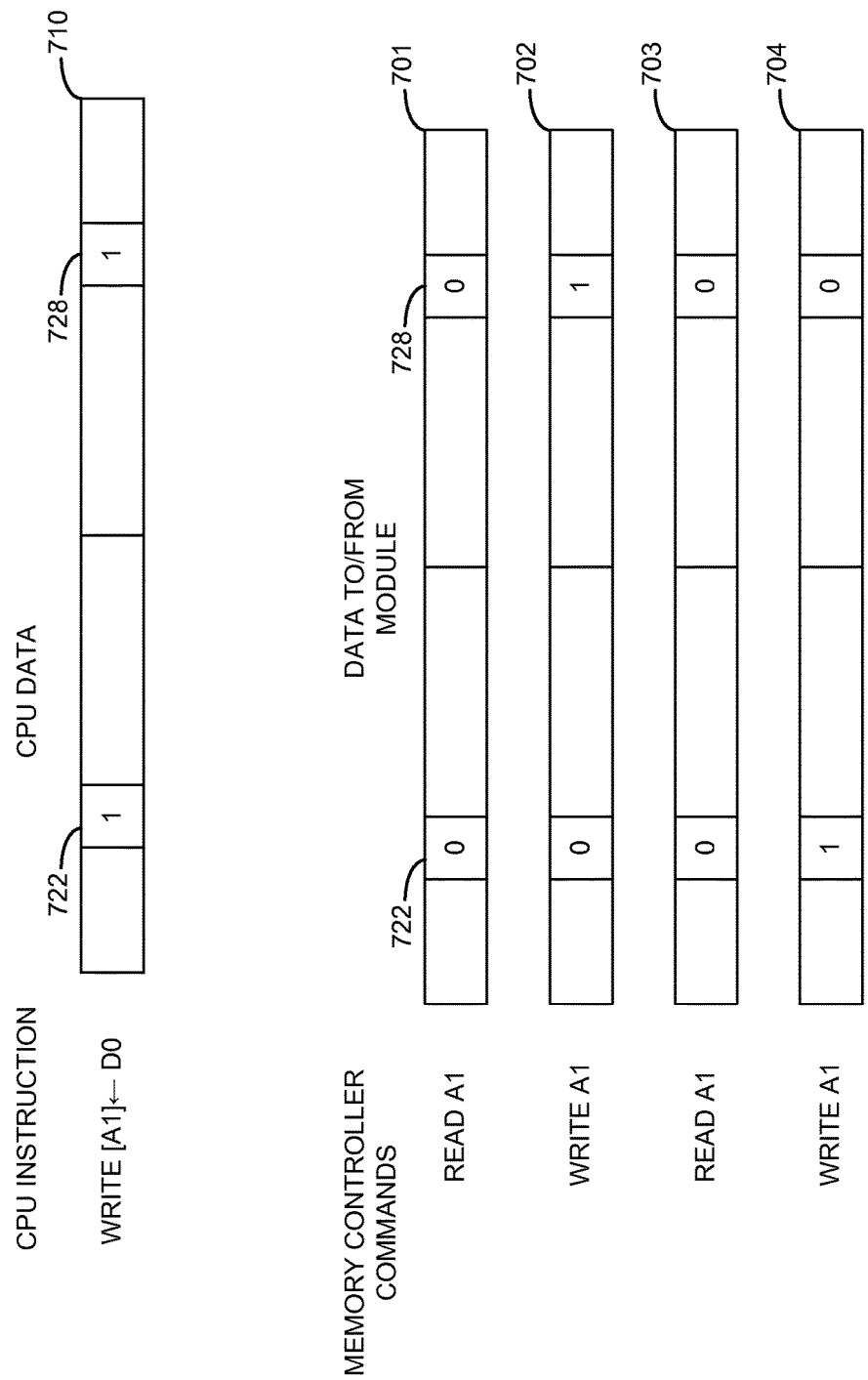
FIG. 7 illustrates an example command communication via a memory interface when a read-modify-write operation is performed by a memory controller.

FIG. 7 illustrates an example command communication via a memory interface when a read-modify-write operation is performed by a memory controller. The operations illustrated in FIG. 7 may be performed by computer system 100. In FIG. 7, a CPU (e.g., CPU 112) receives and executes an instruction to write the data D0 710 to address A1. Data D0 710 includes a first valid bit 722 and a second valid bit 728. Both valid bit 722 and valid bit 728 are set to indicate data D0 710 is valid.

In response to the instruction to write the data D0 710 to address A1, a memory controller (e.g., memory controller 114) issues a read of address A1 to a module (e.g., module 120). The module returns data 701 to the memory controller. The returned data 701 from the module includes the first valid bit 722 and the second valid bit 728. In the returned data 701 from the module, both valid bit 722 and valid bit 728 are set to indicate data 701 is invalid (e.g., both are set to a logic "0"). The memory controller replaces a portion of the returned data 701 with a portion of data D0 710 to form data 702. The memory controller issues a write of data 702 to address A1. As can be seen from data 702, the portion of data D0 710 that has been combined with data 701 includes the second valid bit 728 which is set to indicate data 702 is valid. However, the portion of data 701 that was not replaced with a corresponding portion of data D0 710 includes the unreplaced first valid bit 728 which is set to indicate data 702 is invalid. Thus, when the module receives data 702, the module can determine data 702 is not completely valid because at least one of the first valid bit 722 and the second valid bit 728 indicate data 702 is invalid.

The memory controller then issues a second read of address A1 to the module. The module returns data 703 (which can be—but is not necessarily—identical to data 702) to the memory controller. The returned data 703, like data 701, from the module includes the first valid bit 722 and the second valid bit 728 is set to indicate data 703 is invalid.

The memory controller replaces another portion of the returned data 703 with the remaining portion of data D0 710 to form data 704. The memory controller issues a write of data 704 to address A1. As can be seen from data 704, both portions of data D0 710 have overwritten data 701. Thus, data 704 includes both the first valid bit 722 and the second valid bit 728 set to indicate data 704 is valid. Thus, when the module receives data 704, the module can determine that the portion of data 704 associated with valid bit 722 is valid because the first valid bit 722 indicates the portion of data 704 associated with valid bit 722 is valid. The second valid bit 728 may indicate that data 704 is invalid. However, since data 702 indicated the portion of data 704 associated with valid bit 728 was valid, the module can construct a whole valid data block from the two valid portions from data 702 and data 704.

Figure 8:
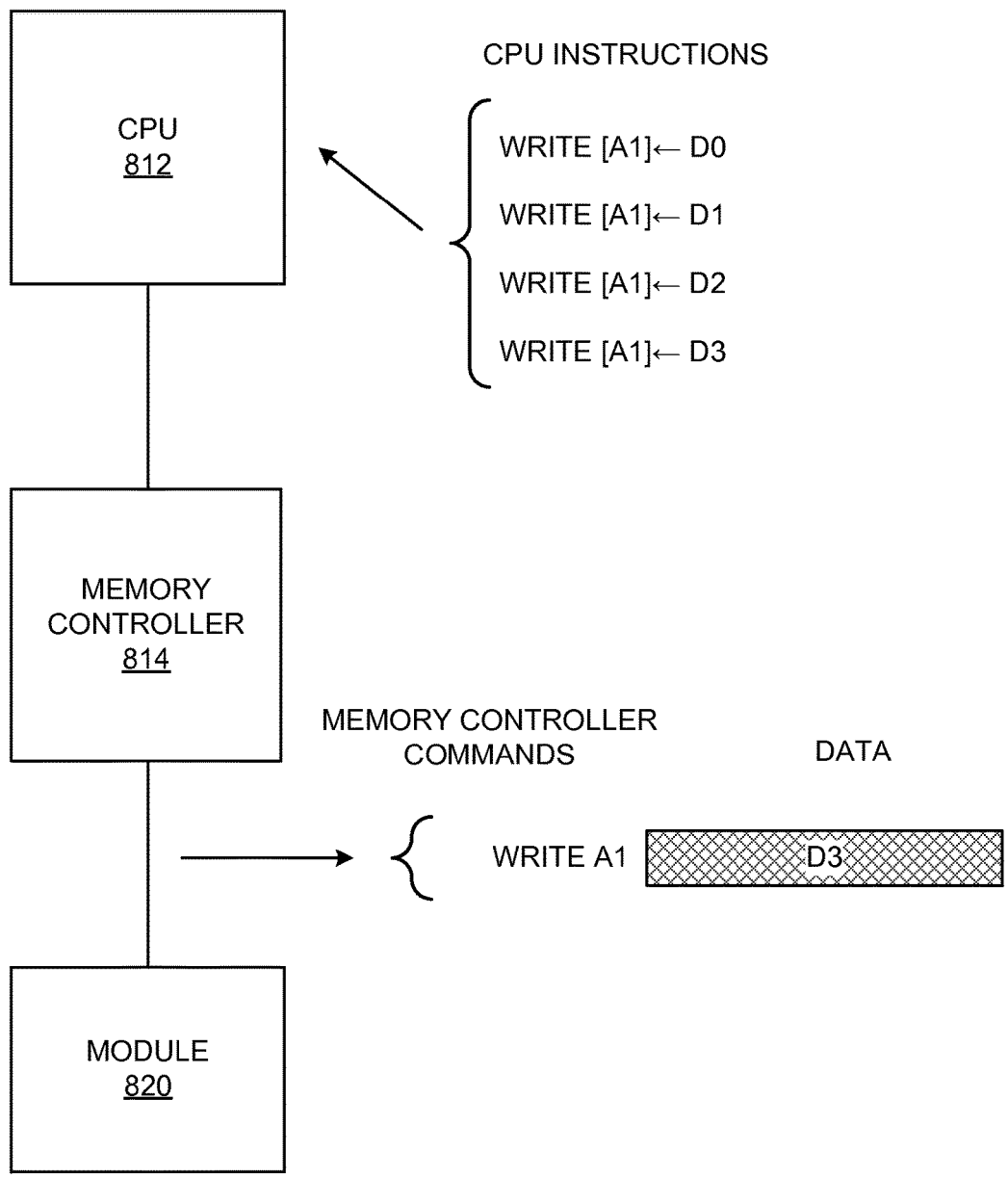
FIG. 8 illustrates write squashing.

FIG. 8 illustrates write squashing. The operations illustrated in FIG. 8 may be performed by computer system 100. In FIG. 8, CPU 812 receives and executes an instruction to write the data D0 to address A1 which resides in module 820. CPU 812 also receives and executes an instruction to write the data D1 to address A1. CPU 812 also receives and executes an instruction to write the data D2 to address A1. CPU 812 also receives and executes an instruction to write the data D3 to address A1. The collective response by CPU 812 and memory controller 814 to these four instructions is, however, that only a single write command is issued to module 820 (e.g., a write of D3 to address A1). Thus, even though CPU 812 executed four write instructions which each wrote different data, module 820 only receives one write command. In other words, the writes of data D0, D1, and D2 have been "squashed" and module 820 is unaware that CPU 812 executed these writes to A1—even though A1 is in module 820's address space.

Figure 9:
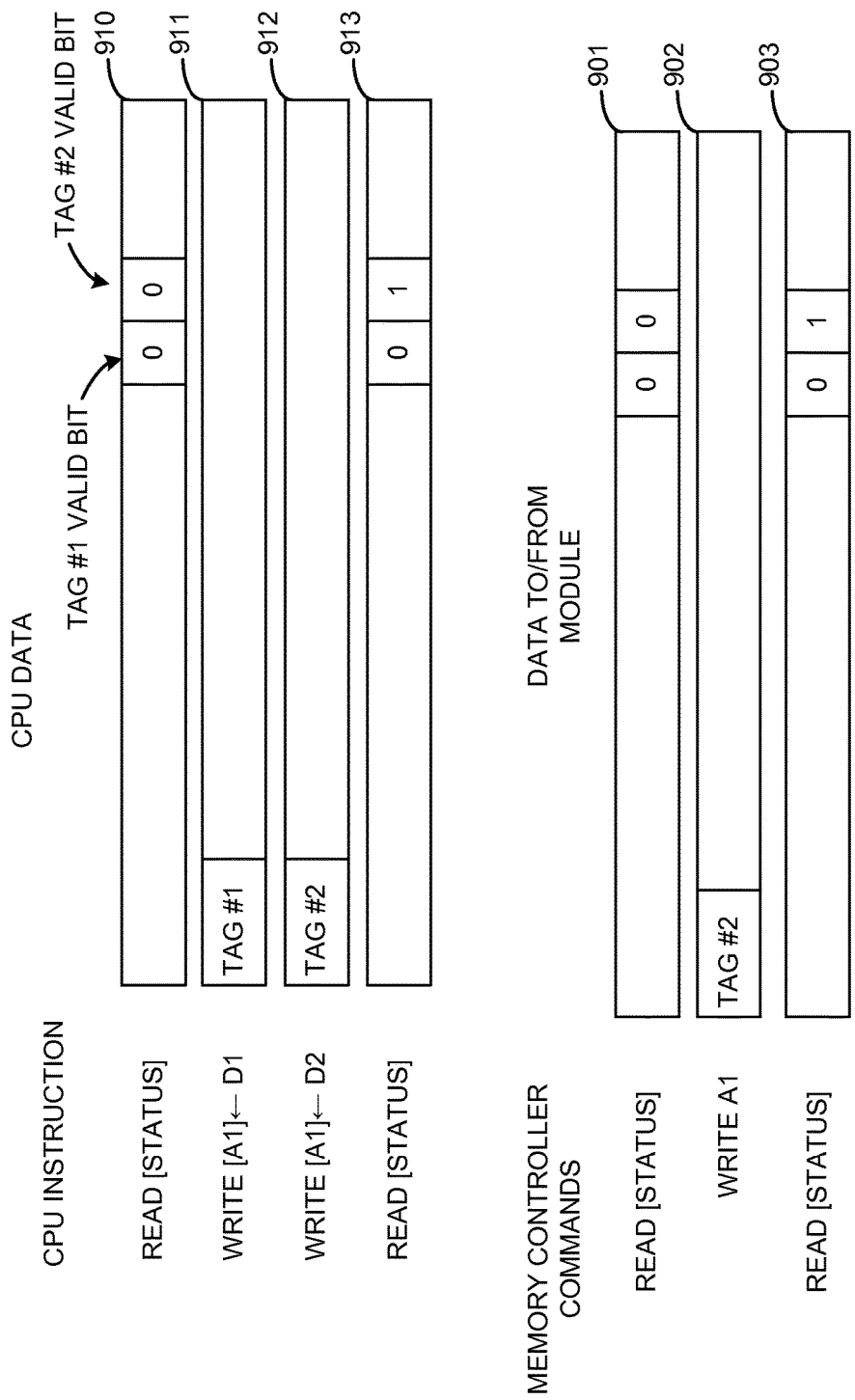
FIG. 9 illustrates an example of detection of a squashed command write.

FIG. 9 illustrates an example detection of a squashed command write. The operations illustrated in FIG. 9 may be performed by computer system 100. In FIG. 9, a CPU (e.g., CPU 112) receives and executes an instruction to read data 910 from an address in a status port (e.g., status port 430) of a module (e.g., module 120). In response, a memory controller (e.g., memory controller 114) issues a read of a location in the status port to the module. The module returns data 901 to the memory controller. The returned data 901 includes a valid bit associated with a first tag (tag #1 valid bit) and a valid bit associated with a second tag (tag #2 valid bit). The returned data 901 received by the CPU from the memory controller as data 910. Data 901 and data 910 have both tag #1 valid bit and tag #2 valid bit set to indicate that both tag #1 and tag #2 have not been received (or executed).

The CPU receives and executes an instruction to write data D1 911 to address A1. Address A1 is in a command port of the module. Data D1 911 includes a tag field with a tag value associated with tag #1. The rest of data D1 911 may be command fields such that data D1 911 comprises a command-tag pair, described herein. The CPU also receives and executes an instruction to write data D2 912 to address A1. Data D2 912 includes a tag field with a tag value associated with tag #2. The rest of data D2 912 may be command fields such that data D2 912 comprises a command-tag pair, described herein.

In response to the instructions to write data D1 911 to address A1, and to write data D2 912 to address A1, the memory controller issues a write of data 902 to the module. Data 902 corresponds to data D2 912. Accordingly, the module receives the command-tag pair associated with tag #2. However, in FIG. 9, the module does not receive the command-tag pair associated with tag #1.

The CPU receives and executes an instruction to read data 913 from an address in the status port of the module. In response, the memory controller issues a read of a location in the status port to the module. The module returns data 903 to the memory controller. Because the module has received a command-tag pair associated with tag #2, the module sets the tag #2 valid bit in data 903 to indicate that tag #2 has been received. Because the module has not received a command-tag pair associated with tag #1, the module sets the tag #1 valid bit in data 903 to indicate that tag #1 has not been received.

The returned data 903 is received by the CPU from the memory controller as data 913. Data 913 has tag #1 valid bit set to indicate that tag #1 has not been received and tag #2 valid bit set to indicate that tag #2 has been received. Thus, when the CPU receives data 913, the CPU can determine that data 911 (and therefore the command-tag pair associated with tag #1) has not been received by the module. In response to determining that the command-tag pair associated with tag #1 has not been received by the module, the CPU may decide to retry writing data 911 to the module. This retry write may be to a different address than A1.

Figure 10:
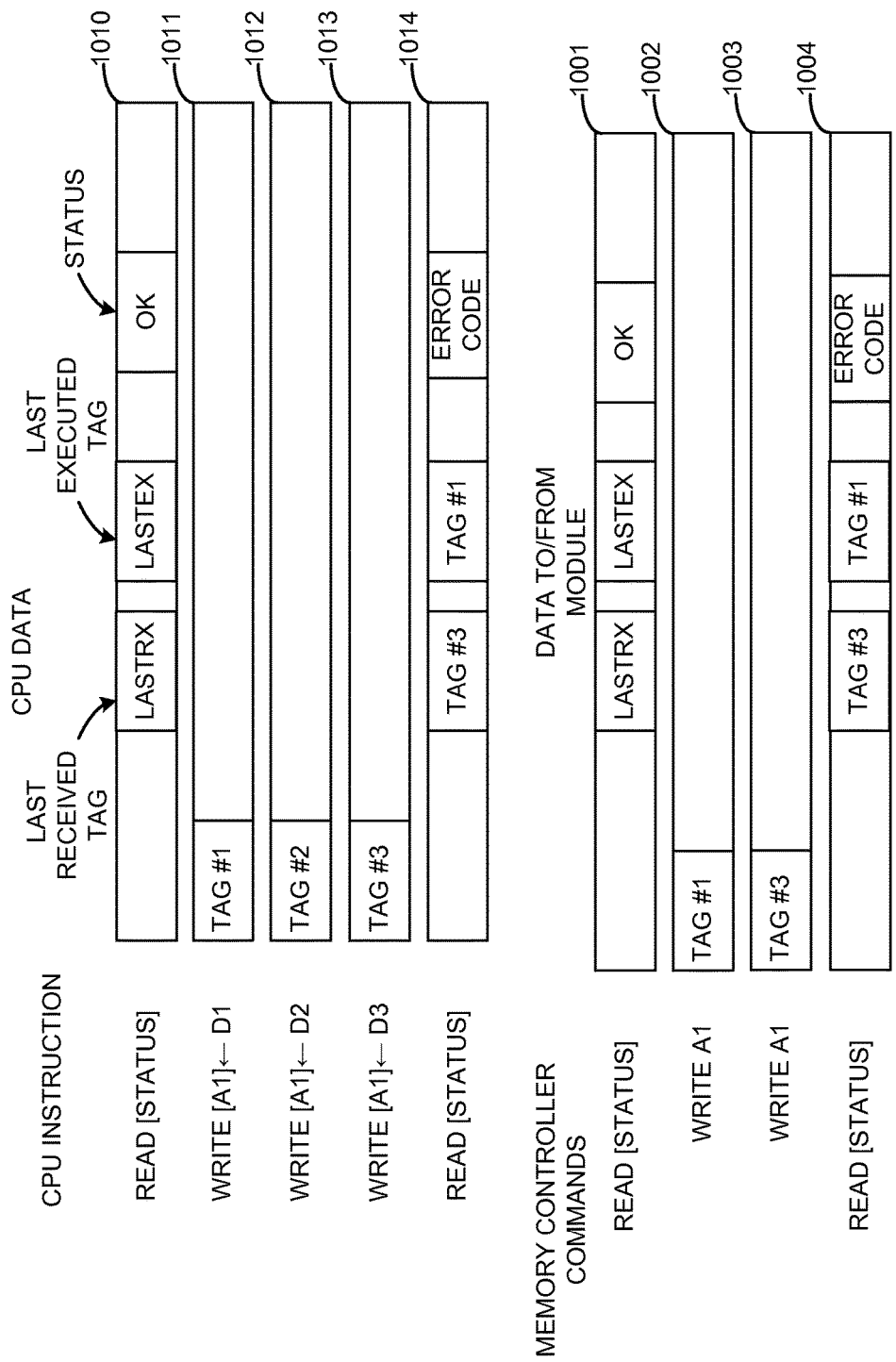
FIG. 10 illustrates another example of detection of a squashed command write.

FIG. 10 illustrates another example detection of a squashed command write. The operations illustrated in FIG. 10 may be performed by computer system 100. In FIG. 10, a CPU (e.g., CPU 112) receives and executes an instruction to read data 1010 from an address in a status port (e.g., status port 430) of a module (e.g., module 120). In response, a memory controller (e.g., memory controller 114) issues a read of a location in the status port to the module. The module returns data 1001 to the memory controller. The returned data 1001 includes a status field, a last executed tag field, and a last received tag field. The returned data 1001 received by the CPU from the memory controller as data 1010. Data 1001 and data 1010 have the status field set to indicate that there is not an error.

The CPU receives and executes an instruction to write data D1 1011 to address A1. Address A1 is in a command port of the module. Data D1 1011 includes a tag field with a tag value associated with tag #1. The rest of data D1 1011 may be command fields such that data D1 1011 comprises a command-tag pair, described herein. The CPU also receives and executes an instruction to write data D2 1012 to address A1. Data D2 1012 includes a tag field with a tag value associated with tag #2. The rest of data D2 1012 may be command fields such that data D2 1012 comprises a command-tag pair, described herein. The CPU also receives and executes an instruction to write data D3 1013 to address A1. Data D3 1013 includes a tag field with a tag value associated with tag #3. The rest of data D3 1013 may be command fields such that data D3 1013 comprises a command-tag pair, described herein.

In response to the instructions to write data D1 1011 to address A1, to write data D2 1012 to address A1, and to write data D3 1013 to address A1, the memory controller issues a write of data 1002 to the module and a write of data 1003 to the module. Data 1002 corresponds to data D1 1011. Data 1003 corresponds to data D3 1013. Accordingly, the module receives the command-tag pair associated with tag #1 and the command-tag pair associated with tag #3. However, in FIG. 10, the module does not receive the command-tag pair associated with tag #2.

The module may execute the command-tag pair associated with tag #1. The CPU receives and executes an instruction to read data 1014 from an address in the status port of the module. In response, the memory controller issues a read of a location in the status port to the module. The module returns data 1004 to the memory controller.

If the module has not yet executed the command-tag pair associated with tag #1, because the module has received a command-tag pair associated with tag #3 thereby overwriting tag #1, the module sets the status field to indicate an "overflow" error to indicate that tag #1 was overwritten before it was executed. The last received tag field can be set to indicate tag #3 was received.

If the module has executed the command-tag pair associated with tag #1, because the module received tag #3 without first receiving tag #2, the module sets the status field to indicate an "out-of-order" error occurred as a result of the write of tag #2 being squashed. The last executed tag field can be set to indicate that tag #1 was executed.

The returned data 1004 is received by the CPU from the memory controller as data 1014. Data 1014 has the status field, last received tag, and last executed tag fields set as appropriate. Thus, when the CPU receives data 1014, the CPU can determine whether data 1012 (and therefore the command-tag pair associated with tag #2) has been received by the module. The CPU can also determine whether data 1011 (and therefore the command-tag pair associated with tag #1) has been received and/or executed by the module. In response to determining that the command-tag pair associated with tag #2 has not been received by the module, the CPU may decide to retry writing data 1012 to the module. This retry write may be to a different address than A1.

Figure 11:
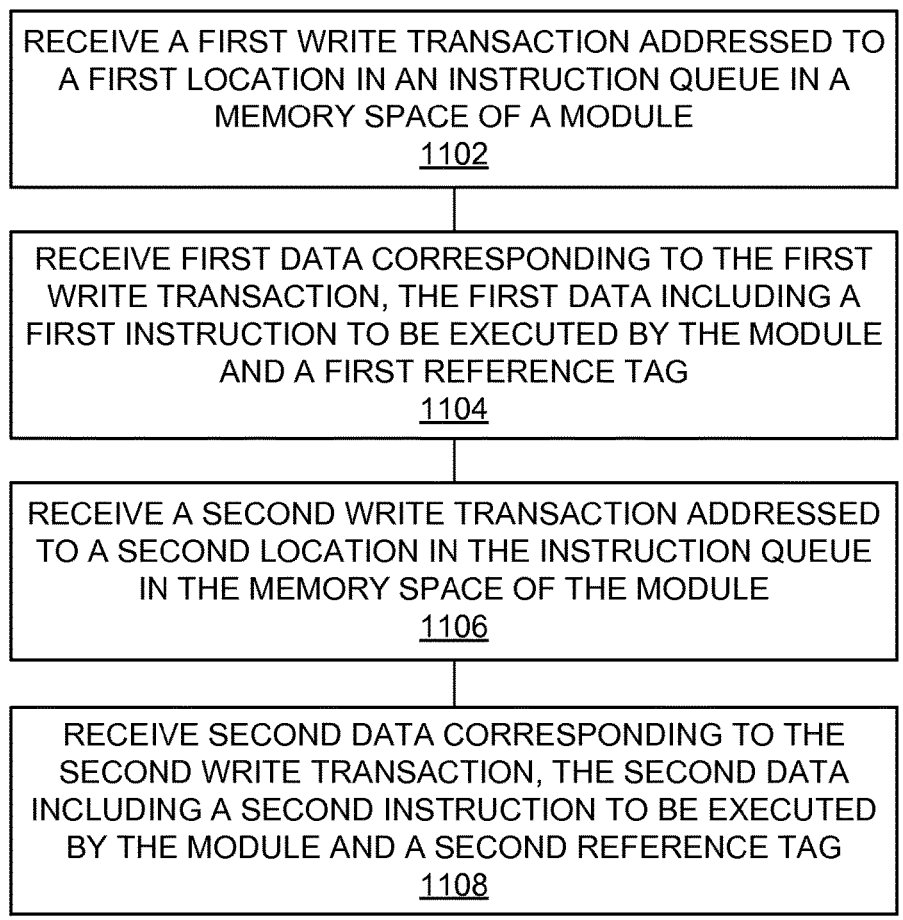
FIG. 11 illustrates a method of communicating commands via a memory interface.

FIG. 11 illustrates a method of communicating commands via a memory interface. The steps illustrated in FIG. 11 may be performed by one or more elements of computer system 100. A first write transaction addressed to a first location in an instruction queue in a memory space of a module is received (1102). For example, module 120 may receive, from memory controller 114, a first write transaction directed to location 0 (zero) in command port 320.

First data corresponding to the first write transaction that includes a first instruction to be executed by the module and a first reference tag is received (1104). For example, module 120 may receive a command-tag pair having a first (e.g., tag #1) tag field 321 value. The opcode field 323 may specify an instruction (or command) to be executed by module 120.

A second write transaction addressed to a second location in the instruction queue in the memory space of the module is received (1106). For example, module 120 may receive, from memory controller 114, a second write transaction directed to location 1 (one) in command port 320.

Second data corresponding to the second write transaction that includes a second instruction to be executed by the module and a second reference tag is received (1108). For example, module 120 may receive a command-tag pair having a second (e.g., tag #2) tag field 321 value. The opcode field 323 of this second command-tag pair may specify an instruction (or command) to be executed by module 120.

The first reference tag may include first instruction order bits and the second reference tag may include second instruction order bits. For example, certain bits of tag field 321 may specify the order that the first instruction and the second instruction are to be executed. Bits of tag field 321 may be used for other purposes—such as ensuring that tag values are unique, or have specified uniqueness over selected address ranges.

The first reference tag may be associated with a first write completion indicator and a second write completion indicator. For example, the first reference tag may be associated with valid bit #1 322 and valid bit #2 328. The first write completion indicator may communicate that a first portion of the first data has been received by the module. The second write completion indicator may communicate that a second portion of the first data has been received by the module.

The module may also receive, from the memory controller, a first read transaction addressed to a first location in status area in the memory space of the module. For example, module 120 may receive a read transaction addressed to a location in status port 430. In response to the first read transaction, the module may send third data that includes an indicator of a status of the first write transaction. This indicator of status may indicate whether the first transaction has been received by the module. This indicator of status may indicate whether a command in the first transaction has been executed by the module.

The devices, circuits, modules, CPU's, controllers, processors, memory, and systems described above may be implemented in computer systems, or include components that are stored by computer systems. The systems described above may also contain one or more components that can be stored on a computer readable medium. Devices, circuits, modules, CPU's, controllers, processors, memory, and systems described herein may be implemented using computer-aided design tools available in the art, and embodied by computer-readable files containing software descriptions of such circuits. This includes, but is not limited to one or more elements of computer system 100, CPU 112, memory controller 114, and modules 120, and their components. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 12:
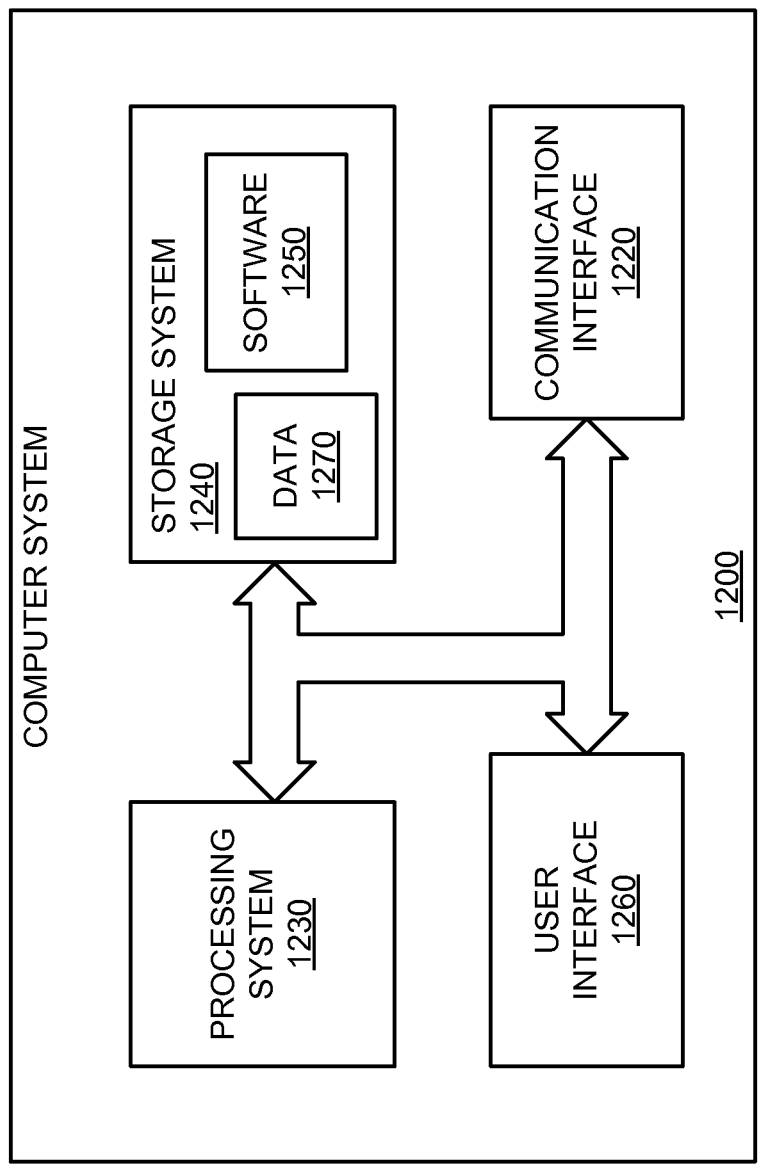
FIG. 12 is a block diagram of a computer system.

FIG. 12 illustrates a block diagram of a computer system. Computer system 1200 includes communication interface 1220, processing system 1230, storage system 1240, and user interface 1260. Processing system 1230 is operatively coupled to storage system 1240. Storage system 1240 stores software 1250 and data 1270. Computer system 1200 may include memory system 100. Processing system 1230 is operatively coupled to communication interface 1220 and user interface 1260. Computer system 1200 may comprise a programmed general-purpose computer. Computer system 1200 may include a microprocessor. Computer system 1200 may comprise programmable or special purpose circuitry. Computer system 1200 may be distributed among multiple devices, processors, storage, and/or interfaces that together comprise elements 1220-1270.

Communication interface 1220 may comprise a network interface, modem, port, bus, link, transceiver, or other communication device. Communication interface 1220 may be distributed among multiple communication devices. Processing system 1230 may comprise a microprocessor, microcontroller, logic circuit, or other processing device. Processing system 1230 may be distributed among multiple processing devices. User interface 1260 may comprise a keyboard, mouse, voice recognition interface, microphone and speakers, graphical display, touch screen, or other type of user interface device. User interface 1260 may be distributed among multiple interface devices. Storage system 1240 may comprise a disk, tape, integrated circuit, RAM, ROM, EEPROM, flash memory, network storage, server, or other memory function. Storage system 1240 may include computer readable medium. Storage system 1240 may be distributed among multiple memory devices.

Processing system 1230 retrieves and executes software 1250 from storage system 1240. Processing system 1230 may retrieve and store data 1270. Processing system 1230 may also retrieve and store data via communication interface 1220. Processing system 1230 may create or modify software 1250 or data 1270 to achieve a tangible result. Processing system 1230 may control communication interface 1220 or user interface 1260 to achieve a tangible result. Processing system 1230 may retrieve and execute remotely stored software via communication interface 1220.

Software 1250 and remotely stored software may comprise an operating system, utilities, drivers, networking software, and other software typically executed by a computer system. Software 1250 may comprise an application program, applet, firmware, or other form of machine-readable processing instructions typically executed by a computer system. When executed by processing system 1230, software 1250 or remotely stored software may direct computer system 1200 to operate.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A module, comprising:
   a memory interface configured to interface with a memory controller, the memory interface including a memory data interface and a memory command/address interface, the memory command/address interface to receive memory controller read commands and first column addresses to read data from the first column addresses of the module and to receive memory controller write commands and second column addresses to write data to the second column addresses of the module, the data to be communicated via the memory data interface; and,
   the module to execute module commands written to the module via the memory data interface from the memory controller using the memory controller write commands, the write commands to be addressed to a first plurality of column addresses in a command port of the module, the memory controller to read information associated with the module commands from a second plurality of column addresses in a status port of the module.

2. The module of claim 1, wherein the memory controller reads the second plurality of column addresses to determine which of the module commands written to the first plurality of column addresses have been received by the module.

3. The module of claim 1, wherein the memory controller reads the second plurality of column addresses to determine which of the module commands written to the first plurality of column addresses have been performed by the module.

4. The module of claim 1, wherein the memory controller reads the second plurality of column addresses in response to at least one DMA instruction processed by a CPU coupled to the memory controller.

5. The module of claim 4, wherein the module includes a processor and a memory, and wherein the second plurality of column addresses are read in response to the at least one DMA instruction directly from the memory and not read from the memory via the processor.

6. The module of claim 1, wherein the memory controller writes the first plurality of column addresses in response to at least one DMA instruction processed by a CPU coupled to the memory controller.

7. The module of claim 6, wherein the module includes a processor and a memory, and wherein the first plurality of column addresses are written in response to the at least one DMA instruction by the memory controller directly to the memory and not written to the memory via the processor.

8. A dual-inline memory module (DIMM), comprising:
a parallel module interface configured to interface with a memory controller of a host system, the parallel module interface including a memory data interface and a memory command/address interface, the memory command/address interface to receive memory controller read commands and first column addresses to read data from the first column addresses of the DIMM and to receive memory controller write commands and second column addresses to write data to the second column addresses of the DIMM, the data to be communicated via the memory data interface, the host to provide, to the memory controller for provision to the module, first data comprising a plurality of module commands to be executed by the module and to be written, via the memory data interface, to a first memory address range that functions as a command port for the DIMM using the memory controller write commands, and the host to read via the memory controller, from a second memory address range that functions as a status port for the DIMM, second data comprising indicators associated with the plurality of commands.

9. The module of claim 8, wherein the host provides the first data in response to a DMA operation performed by the host.

10. The module of claim 8, wherein the host reads the second data in response to a DMA operation performed by the host.

11. The module of claim 10, wherein the second data comprises a plurality of entries each corresponding to one of the plurality of commands stored to the command port.

12. The module of claim 8, wherein the module includes a processor and a memory, and wherein the first data is to be written to the first memory address range of the module directly to the memory in response to at least one DMA operation performed by the host and not written to the memory via the processor.

13. The module of claim 8, wherein the module includes a processor and a memory, and wherein the second data is to be read from the second memory address range of the module directly from the memory in response to at least one DMA operation performed by the host and not read from the memory via the processor.

14. The module of claim 8, further comprising:
a processor;
a memory associated with the first memory address range and the second memory address range, wherein the first data is to be written to the first memory address range of the module directly to the memory in response to a first DMA operation performed by the host, and wherein the second data is to be read from the second memory address range of the module directly from the memory in response a second one DMA operation performed by the host, the first DMA operation and the second DMA operation not using the processor to access to the memory.

15. A system, comprising:
a central processing unit (CPU) with a memory controller configured to direct delivery of module commands from the CPU to module memory using parallel data channels; and,
a dual-inline memory module (DIMM) configured to receive the module commands from the CPU, including:
a parallel module interface configured to interface with a memory controller of the system, the parallel module interface including a memory data interface and a memory command/address interface, the memory command/address interface to receive memory controller read commands and first column addresses to read data from the first column addresses of the DIMM and to receive memory controller write commands and second column addresses to write data to the second column addresses of the DIMM, the data to be communicated via the memory data interface, the host to provide, to the memory controller for provision to the module, first data comprising a plurality of module commands to be executed by the module and to be written, via the memory data interface, to a first memory address range of the module that functions as a command port for the DIMM using the memory controller write commands, and to read, from a second memory address range of the module that functions as a status port for the DIMM, second data comprising indicators associated with the plurality of module commands; and,
a processor to execute the module commands and to provide the second data.

16. The system of claim 15, wherein the second data includes entries that indicate whether an associated module command written to the command port has been executed by the module.

17. The system of claim 15, wherein the second data includes entries that indicate whether an associated module command written to the command port has been received by the module.

18. The system of claim 15, wherein the first data is provided in response to a DMA instruction performed by the CPU and the second data includes an entry that indicates whether the DMA instruction has completed writing the first data.

19. The system of claim 15, wherein the first data is provided in response to a first DMA operation performed by the CPU and the second data is read in response to a second DMA operation performed by the CPU.

20. The system of claim 19, wherein the first data is provided to a memory on the module and the second data is read from the module without using the processor to write the first data to the memory and without using the processor to read the second data from the memory.

* * * * *